United States Patent
O'Leary et al.

(10) Patent No.: US 8,823,419 B1
(45) Date of Patent: Sep. 2, 2014

(54) PING PONG COMPARATOR VOLTAGE MONITORING CIRCUIT

(71) Applicant: Analog Devices Technology, Hamilton (BM)

(72) Inventors: Finbarr O'Leary, Edinburgh (GB); Michael Edward Bradley, Limerick (IE); Naiqian Ren, Limerick (IE); George R. Spalding, Edinburgh (GB); Nigel David Brooke, Ballina (IE)

(73) Assignee: Analog Devices Technology, Hamilton (BM)

( * ) Notice: Subject to any disclaimer, the term of this patent is extended or adjusted under 35 U.S.C. 154(b) by 0 days.

(21) Appl. No.: 13/792,835

(22) Filed: Mar. 11, 2013

(51) Int. Cl.
*H03K 5/153* (2006.01)

(52) U.S. Cl.
USPC .................. 327/77; 327/73; 327/205; 327/68

(58) Field of Classification Search
USPC ........................................ 327/77, 68, 205, 73
See application file for complete search history.

(56) References Cited

U.S. PATENT DOCUMENTS

| | | | | |
|---|---|---|---|---|
| 5,418,409 | A | * | 5/1995 | Kuhn ............................... 327/78 |
| 5,933,459 | A | * | 8/1999 | Saunders et al. .............. 375/317 |
| 2012/0319735 | A1 | * | 12/2012 | Nagda et al. .................... 327/73 |

* cited by examiner

*Primary Examiner* — Lincoln Donovan
*Assistant Examiner* — Patrick Chen
(74) *Attorney, Agent, or Firm* — Schwegman Lundberg & Woessner, P.A.

(57) ABSTRACT

A ping pong comparator voltage monitoring circuit which includes first and second comparators having inputs connected to a voltage Vin to be monitored, and second inputs connected to first and second nodes, respectively. A multiplexer alternately couples the first and second comparator outputs to an output in response to a periodic control signal. A ground-referenced voltage Vref1 is provided at a third node and a voltage Vref2 referenced to Vref1 is at a fourth node. A hysteresis hyst1 is switchably connected between the third and first nodes, and a hysteresis hyst2 is switchably connected between the fourth and second nodes. Hyst1 and hyst2 are switched in when the mux output toggles due to a rising Vin, and are switched out when the mux output toggles due to a falling Vin.

8 Claims, 3 Drawing Sheets

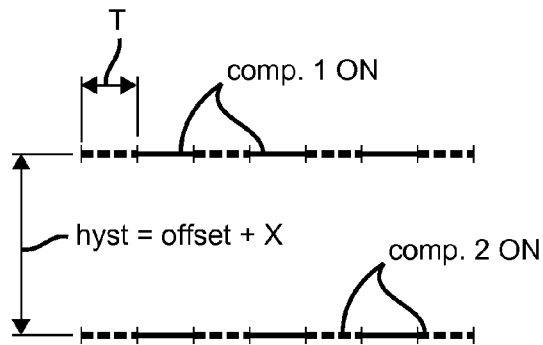
FIG. 4
FIG. 5
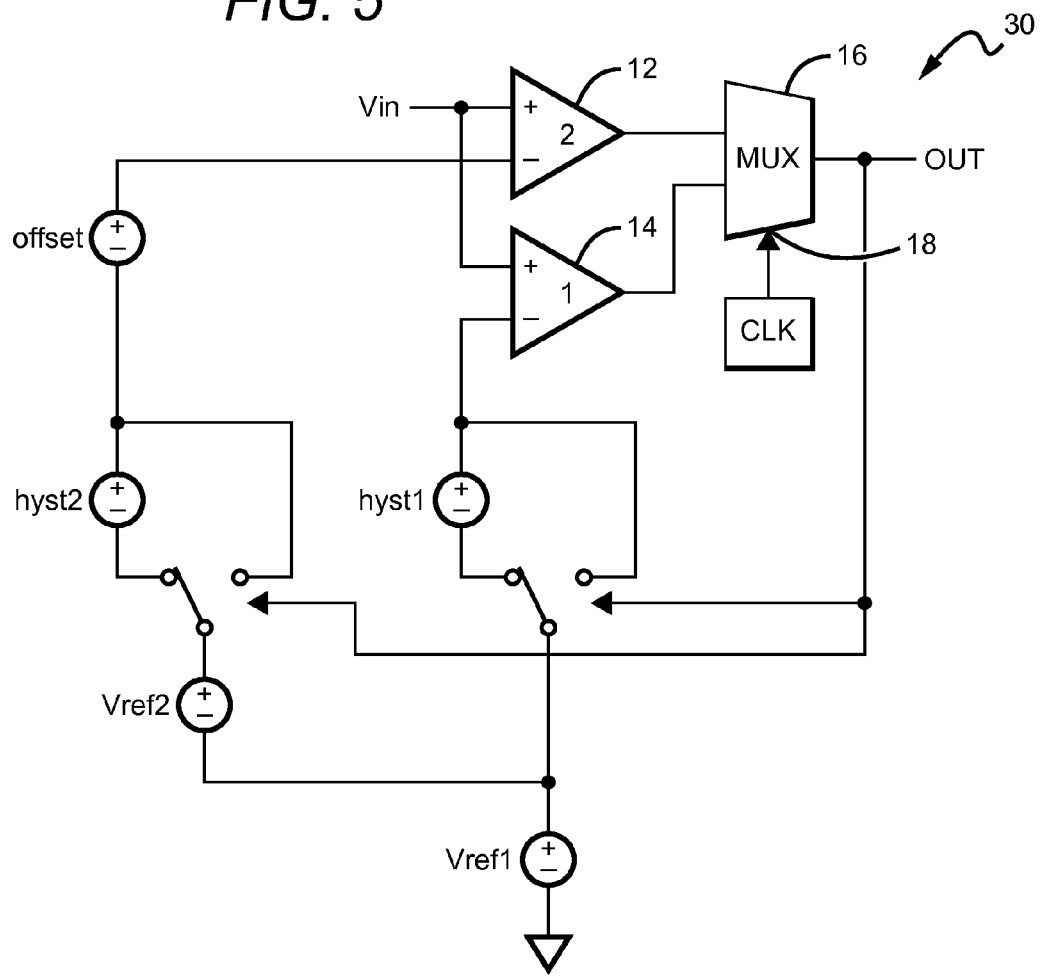

PING PONG COMPARATOR VOLTAGE MONITORING CIRCUIT

BACKGROUND OF THE INVENTION

1. Field of the Invention

This invention relates generally to comparators, and more particularly to ping pong comparators employed to monitor an input voltage.

2. Description of the Related Art

One method of monitoring the level of a given voltage is to use a comparator circuit. Here, a reference voltage (Vref) and the voltage to be monitored (Vin) are applied to the inputs of a comparator, the output of which toggles when Vin increases above or falls below Vref. To provide highly accurate monitoring, the comparator may be periodically auto-zeroed to avoid offset drift which can degrade accuracy. To achieve continuous monitoring, two comparators can be used in a 'ping pong' configuration, which allows one comparator to keep monitoring while the other is being auto-zeroed. However, this periodic switching comes with a side effect: a parasitic offset mismatch between the two comparators could potentially yield different comparison results, even if both Vin and Vref remain constant. As a result, the comparator output could become a periodic square wave if Vin is close to Vref.

This problem can be mitigated by adding hysteresis onto the comparator input; however, simply adding a fixed amount of hysteresis onto both comparators can result in additional problems. For example, for reliable operation, the minimum hysteresis value for the individual comparators needs to be larger than the offset mismatch between the two comparators. Depending on the mismatch, this could result in large hysteresis values. This could degrade the monitoring accuracy, especially if Vin is a low voltage for which the hysteresis would be a large percentage of the input threshold. Another drawback is that the hysteresis value needed can vary over time and with changes in the offset mismatch.

This is illustrated with reference to FIG. 1, which depicts a basic voltage monitoring circuit 10 that uses a ping pong comparator circuit. First and second comparators '1' and '2' are used to monitor an input voltage Vin, which is provided to both comparators. A multiplexer 16 (or "mux") is connected to receive the outputs of the first and second comparators at first and second inputs, respectively, and to receive a periodic control signal (CLK) at a 'select' input 18. The mux is arranged to alternately couple the voltage applied to its first and second inputs to its output OUT in response to CLK. Thus, each comparator is switched in for half of the clock period, allowing the other to be auto-zeroed in ping-pong fashion. Mux output OUT is the output of the voltage monitoring circuit.

Reference voltage Vref is applied to the other input of each comparator. However, due to offset mismatch, represented in FIG. 1 as a fixed voltage source 'offset' (which can be positive, negative or zero), the actual value to which Vin is compared by each comparator can be different. As noted above, this can be addressed by adding hysteresis, represented in FIG. 1 as a fixed voltage source 'hyst'. The hysteresis is typically arranged to be switched in series between Vref and the comparators when mux output OUT is low, which indicates a rising Vin value; the hysteresis is then bypassed when OUT is high.

When the offset mismatch is zero, the rising and falling trip thresholds for comparator 1 (Vrise1 and Vfall1) are given by:

$Vrise1 = Vref + hyst \pm 0$ (due to zero offset)

$Vfall1 = Vref \pm 0$

When Vrise1 and Vfall1 are the rising and falling thresholds, respectively, the hysteresis voltage (Vhyst1) for comparator 1 is given by:

$Vhyst1 = Vrise1 - Vfall1 = hyst$

The rising and falling trip thresholds for comparator 2 (Vrise2 and Vfall2) are given by:

$Vrise2 = Vref + hyst$ $Vfall2 = Vref$

The hysteresis voltage (Vhyst2) for comparator 2 is given by:

$Vhyst2 = Vrise2 - Vfall2 = hyst$

Thus, in this ideal case, both comparators have the same rising and falling thresholds, closely resembling a circuit employing only one comparator.

If the offset mismatch between the two comparators is not zero, then the rising and falling trip thresholds and the hysteresis voltage for comparator 1 (Vrise1, Vfall1, Vhyst1) are given by:

$Vrise1 = Vref + hyst \pm offset$ $Vfall1 = Vref \pm offset$ $Vhyst1 = Vrise1 - Vfall1 = hyst$ where offset=|offset1−offset2| and offset1 and offset2 are the offset voltages associated with comparators 1 and 2, respectively.

The rising and falling trip thresholds and hysteresis voltage for comparator 2 (Vrise2, Vfall2, Vhyst2) are given by:

$Vrise2 = Vref + hyst$ $Vfall2 = Vref$ $Vhyst2 = Vrise2 - Vfall2 = hyst$

Although the two comparators share the same input hysteresis value (hyst), they have different rising and falling thresholds. If one comparator's falling threshold is higher than the other's rising threshold, a potential output disagreement between the two comparators can be caused by an input voltage that is at a level between the two thresholds, in which case one comparator determines that OUT should be high and another determines it should be low. Due to the nature of the ping pong comparators, only one comparator determines the output at a time. But because of the periodic switching of the comparators, if Vin remains constant, an output disagreement could create a square wave waveform at OUT.

Simply adding more hysteresis to the comparators could solve this output switching problem, but the hysteresis value would be required to be larger than the offset mismatch between the comparators. This makes it difficult to use a small hysteresis value, which tends to reduce the voltage monitoring accuracy. Also, the effective hysteresis can vary with the offset mismatch, and thus vary from part to part.

SUMMARY OF THE INVENTION

A ping pong comparator voltage monitoring circuit is presented which addresses the problems discussed above, enabling the use of a low hysteresis value independent of the comparator offset mismatch.

The present ping pong comparator voltage monitoring circuit includes:

a first comparator having a first input connected to a voltage Vin to be monitored, a second input connected to a first node, and an output which toggles from a first state to a second state when Vin increases above the voltage applied to the comparator's second input and toggles from the second state to the first state when Vin falls below the voltage applied to the first comparator's second input;

a second comparator having a first input connected to Vin, a second input connected to a second node, and an output which toggles from a first state to a second state when Vin increases above the voltage applied to the second comparator's second input and toggles from the second state to the first state when Vin falls below the voltage applied to the second comparator's second input;

a multiplexer ("mux") connected to receive the outputs of the first and second comparators at first and second inputs, respectively, and to receive a periodic control signal at a 'select' input, the mux arranged to alternately couple the voltage applied to its first and second inputs to an output in response to the periodic control signal, the mux output being the output of the voltage monitoring circuit;

a first reference voltage source which produces a voltage Vref1 at a third node which is referenced to a circuit common point;

a second reference voltage source which produces a voltage Vref2 at a fourth node which is referenced to Vref1 such that the voltage at the fourth node is given by Vref1+Vref2;

a first hysteresis voltage source which produces a voltage hyst1 and is arranged to be switchably connected between the third and first nodes; and a second hysteresis voltage source which produces a voltage hyst2 and is arranged to be switchably connected between the fourth and second nodes;

the voltage monitoring circuit arranged such that the first and second hysteresis voltage sources are switched in such that the voltage at the first node is Vref1+hyst1 and the voltage at the second node is Vref1+Vref2+hyst2 when the mux output has toggled from the first state to the second state due to a rising value of Vin, and such that the voltage at the first node is Vref1 and the voltage at the second node is Vref1+Vref2 when the mux output has toggled from the second state to the first state due to a falling value of Vin.

These and other features, aspects, and advantages of the present invention will become better understood with reference to the following description and claims.

BRIEF DESCRIPTION OF THE DRAWINGS

FIG. 4 is a diagram illustrating the hysteresis of the two comparators with zero offset.

FIG. 5 is a block/schematic diagram of a ping pong comparator circuit per the present invention.

DETAILED DESCRIPTION OF THE INVENTION

One approach to the problems identified above is to add hysteresis as needed to prevent the occurrence of the output switching problem described above. To make sure that there is no falling threshold above a rising threshold, all comparator input levels are examined. The terms appearing in the equations below are as previously defined.

First:

$$Vref+hyst \pm offset > Vref => hyst > |offset|,$$

Vrise2 must always be higher than Vfall1, leading to:

$$Vref+hyst > Vref \pm offset => hyst > |offset|$$

This means that, for this approach to work, the hysteresis value needs to be larger than the offset mismatch between the two comparators.

$$\text{Let hyst} = |\text{offset\_max}| + X,$$

where offset_max is the maximum offset between the two comparators and X is a fixed value chosen by the user. The equations then become:

$$Vrise1 = Vref+|offset|+X \pm offset$$

$$Vfall1 = Vref \pm offset$$

$$Vrise2 = Vref+|offset|+X$$

$$Vfall2 = Vref$$

Figure 1:
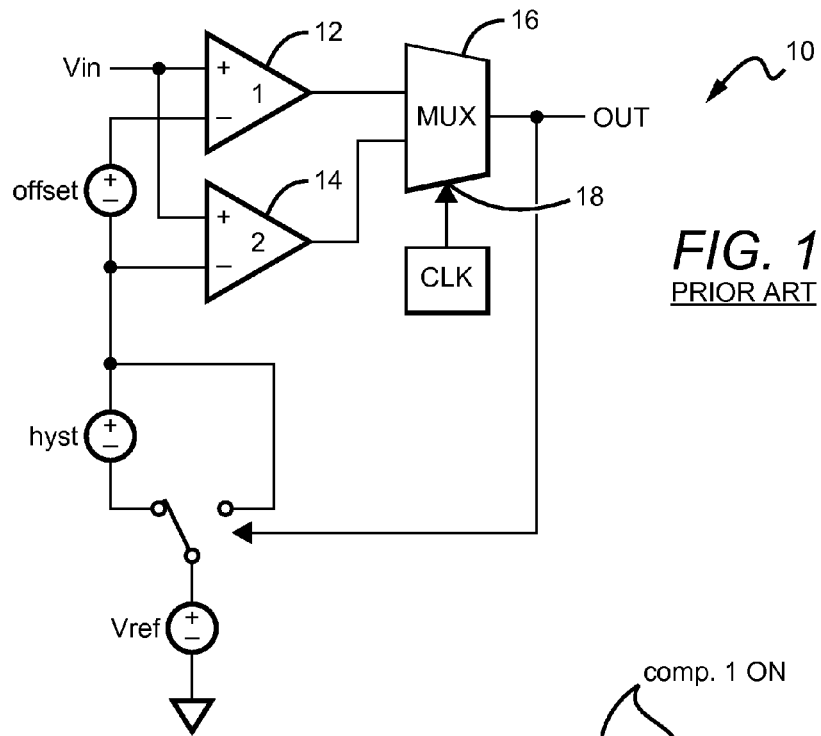
FIG. 1 is a block/schematic diagram of a known ping pong comparator circuit.
Figure 2:
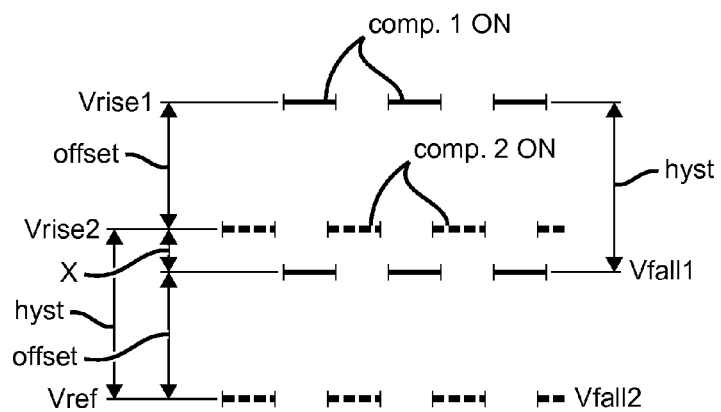
FIG. 2 is a diagram illustrating the hysteresis of the two comparators with a maximum positive offset.
Figure 3:
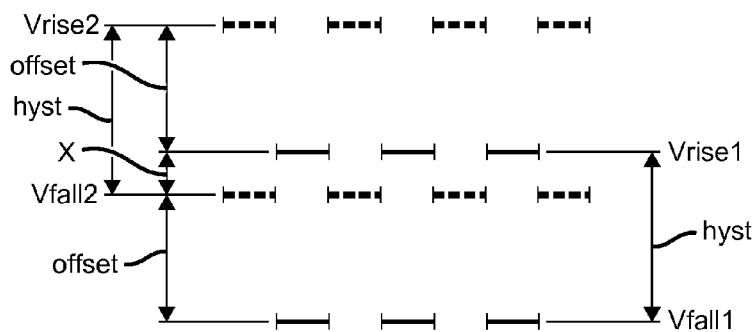
FIG. 3 is a diagram illustrating the hysteresis of the two comparators with a maximum negative offset.

FIGS. 2 and 3 show the hysteresis for the two comparators when the offset is at a maximum positive value and at a maximum negative value, respectively. If the offset between the two comparators is not zero, then there are two pairs of rising and falling thresholds, depending on which of the two comparators is "on duty" (as indicated by the dashed lines). If Vin rises above the higher of the rising thresholds, both comparators would detect the input rise and change their output status. But if Vin is above the lower Vrise threshold but below the higher one, only one comparator would detect the rise in Vin. The output OUT would change quickly if the right comparator was on duty at the right time; otherwise there will be a delay in the change of output status until the comparator switch-over. The worst case delay for this is half of the clock cycle, plus propagation delay.

The hysteresis for both individual comparators is hyst; due to the ping-pong action, a slow rising or falling Vin could experience hysteresis created by combining the thresholds of the two comparators. Assume here that the offset value is at its maximum positive value. Then:

$$\text{hyst\_small} = Vrise2 - Vfall1$$

$$= Vref+|offset|+X-Vref-offset$$

$$= X$$

$$\text{hyst\_large} = Vrise1 - Vfall2$$

$$= Vref+|offset|+X+offset-Vref=hyst+offset$$

$$= 2 \times |offset|+X$$

where hyst is the hysteresis value for each individual comparator, and hyst_small and hyst_large refer to the hysteresis values that result if the comparator thresholds are combined.

Similar values can be derived if the offset value is assumed to be at its maximum negative value.

Thus, hyst_small is formed by the lower rising threshold and the higher falling threshold, and hyst_large is formed by the higher rising threshold and lower falling threshold. These two terms are useful to examine the circuit reaction and its effective hysteresis with slow- and fast-changing input signals.

If Vin is rising or falling slowly, hyst_small would become the effective hysteresis. The output in this case can suffer some delay as discussed above, but smaller overdrive naturally comes with longer delay. For a Vin with a large slew rate (fast changing), the hysteresis value can be either hyst_small or hyst_large, depending on where Vin crosses the thresholds. But whether hyst_small or hyst_large, with a large slew rate Vin will hit the threshold very quickly and thus the output reaction time would be short.

This solution appears to avoid output toggling. One can define hyst_large by choosing hyst if the maximum offset value is known; the minimum value of hyst_small is not limited by the offset. But a problem arises when the offset voltage changes from part to part. Since both hyst_large and hyst_small are a function of offset, as the offset changes these hysteresis values change as well. If the two comparators are perfectly matched, offset=0 and then:

$$\text{hyst\_large}=V\text{rise2}-V\text{fall1}=V\text{ref}+\text{hyst}-V\text{ref}+0=\text{hyst}$$

$$\text{hyst\_small}=V\text{rise1}-V\text{fall2}=V\text{ref}+\text{hyst}+0-V\text{ref}=\text{hyst}$$

This is illustrated in FIG. 4, which shows the comparator hysteresis of the two comparators with zero offset difference; T is the ON period of each comparator.

Both hystereses can be varied by:

$$\text{hyst-}X=|\text{offset}|$$

In this case, even a slowly rising or falling input signal would experience input hysteresis of |offset|+X. This makes the datasheet specification of a hysteresis value difficult to know and potentially large. This is especially undesirable for low level voltage monitoring, as the offset could become a large percentage of the threshold. From an accuracy perspective, both rising and falling thresholds for this approach could vary by ±offset.

Thus, while this approach is simple to implement, it also requires a large hysteresis specification, which degrades monitoring accuracy. Furthermore, the hysteresis value changes with offset, and thus can vary from part to part.

Figure 6:
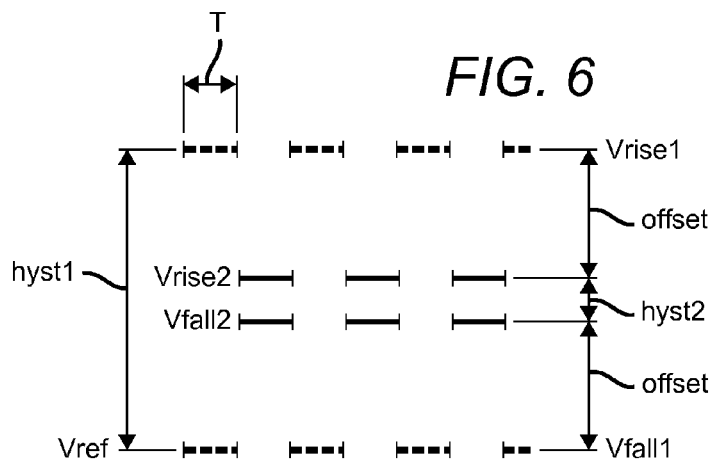
FIG. 6 is a diagram illustrating the hysteresis of the two comparators when using a large and small hysteresis implementation, with zero offset.

These drawbacks are overcome with the ping pong comparator voltage monitoring circuit shown in FIG. 5. This solution uses different hysteresis values for the two comparators: a small hysteresis on one and a large hysteresis on the other. The small hysteresis—"hyst2" in FIG. 5—can be used as the hysteresis specification on the product's datasheet. The large hysteresis—"hyst1"—needs to be large enough to "contain" the small hysteresis band, plus worst case offset variations between the two comparators, as shown in FIG. 6. A voltage source Vref2 is required to "lift hyst2 up" so that both comparators have equal average (center) threshold values. This means that the comparator with the small hysteresis would have a higher falling threshold reference; if the comparator with the larger hysteresis has a falling threshold=Vref, then the comparator with the smaller hysteresis would have a falling threshold Vref+Vref2, where Vref2=|offset|.

In the case where the offset is zero, the equations for the rising and falling thresholds are as follows. Comparator 1 (with large hysteresis hyst1):

$$V\text{rise1}=V\text{ref}+\text{hyst1}$$

$$V\text{fall1}=V\text{ref}$$

$$V\text{hyst\_large}=V\text{rise1}-V\text{fall1}=\text{hyst1}$$

Comparator 2 (with small hysteresis hyst2):

$$V\text{rise2}=V\text{ref}+V\text{ref2}+\text{hyst2}\pm 0$$

$$V\text{fall2}=V\text{ref}+V\text{ref2}\pm 0$$

$$V\text{hyst\_small}=V\text{rise2}-V\text{fall2}=\text{hyst2}$$

In the case where the offset mismatch between the two comparators is at its maximum, the equations for the rising and falling thresholds are as follows.

Comparator 1:

$$V\text{rise1}=V\text{ref}+\text{hyst1}$$

$$V\text{fall1}=V\text{ref}$$

Comparator 2:

$$V\text{rise2}=V\text{ref}+V\text{ref2}+\text{hyst2}\pm\text{offset}$$

$$V\text{fall2}=V\text{ref}+V\text{ref2}\pm\text{offset}$$

To ensure that there is no output dispute, the rising threshold of one comparator must be above the falling threshold of the other comparator. Thus:

$$V\text{ref}+V\text{ref2}+\text{hyst2}\pm\text{offset}>V\text{ref}=>V\text{ref2}+\text{hyst2}>|\text{offset}|$$

Let Vref2=|offset|
Then:

$$V\text{ref}+\text{hyst1}>V\text{ref}+V\text{ref2}\pm\text{offset}=>\text{hyst1}>V\text{ref2}+|\text{offset}|$$

Let hyst1=Vref2+|offset|+X,
where X is a fixed value chosen by the user.
Combining the equation above gives:

$$\text{hyst1}=2\times|\text{offset}|+X$$

The hysteresis values are hyst1 and hyst2 for comparators 1 and 2, respectively. Due to the ping-pong action, a slowly rising and falling Vin would experience only the small hysteresis on comparator 2. If the offset value is at its maximum positive value:

$$V\text{hyst\_small}_{\textit{off\_max}}=V\text{rise1}-V\text{fall2}$$

$$=V\text{ref}+\text{hyst1}-V\text{ref}-V\text{ref2}-\text{offset}$$

$$=2\times|\text{offset}|+X-|\text{offset}|-\text{offset}$$

$$=X$$

If we make X=hyst2, then the hysteresis here would become hyst2.

If the offset value is at its maximum negative value:

$$V\text{hyst\_small}_{\textit{offset\_min}}=V\text{rise2}-V\text{fall1}$$

$$=V\text{ref}+V\text{ref2}+\text{hyst2}-\text{offset}-V\text{ref}$$

$$=|\text{offset}|-\text{offset}+\text{hyst2}$$

$$=\text{hyst2}$$

Thus, no matter what the offset value is, the hysteresis experienced by a slowly rising and falling Vin would be hyst2.

Figure 7:
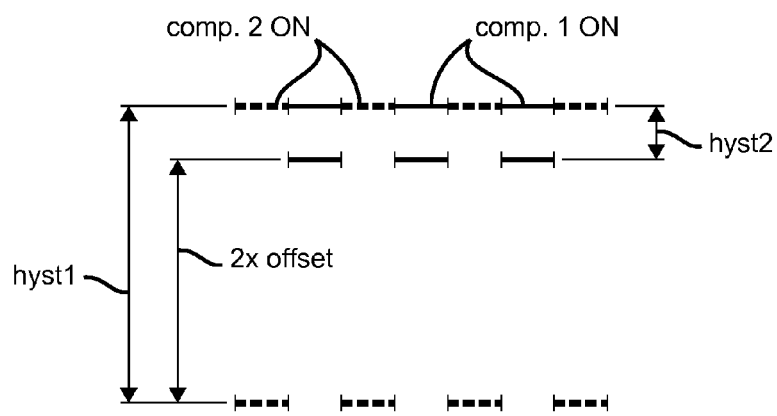
FIG. 7 is a diagram illustrating the hysteresis of the two comparators when using a large and small hysteresis implementation, with maximum positive offset.
Figure 8:
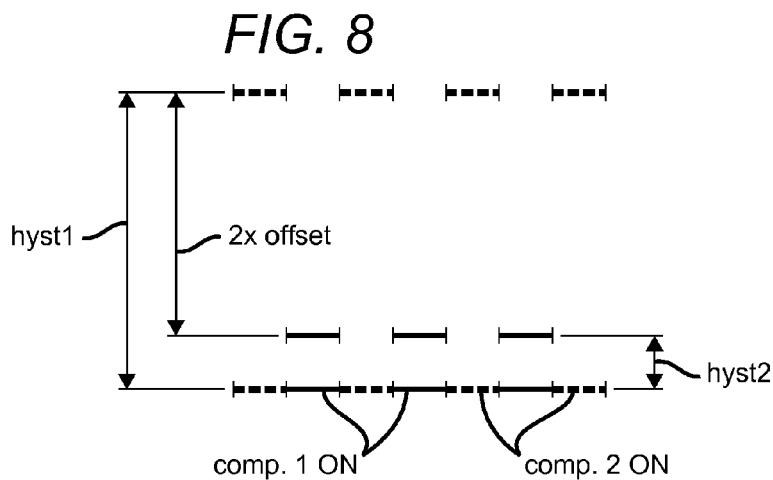
FIG. 8 is a diagram illustrating the hysteresis of the two comparators when using a large and small hysteresis implementation, with maximum negative offset.

The comparator hysteresis with small and large hysteresis values, with zero offset, was illustrated in FIG. 6. Graphical illustration of the hysteresis for the maximum positive and maximum negative offset cases is shown in FIGS. 7 and 8, respectively.

Vin would be detected immediately if it crosses a threshold set by comparator 1, as either comparator would detect the voltage at this level. Comparator 2 may miss Vin if it is not on duty, so its reaction time to Vin crossing its threshold could be longer. The reaction time depends on the comparator switching period T and propagation delay.

For a slowly rising/falling Vin, hyst2 becomes the effective hysteresis, and for inputs with a large slew rate, the hysteresis value can be either hyst2 or hyst1, depending on where Vin crosses the thresholds. But no matter which one it is, with a large slew rate, Vin will hit a threshold very quickly and thus the output reaction time will be short. This matches the characteristic of most voltage monitoring devices, for which higher overdrive results in a shorter delay.

Thus, for the approach shown in FIG. 5, the effective hysteresis for small overdrive—hyst2—is constant, independent of the offset mismatch between the two comparators. This allows a small hysteresis value to be specified on the product datasheet. The approach's potentially slow response to small input overdrive is masked by the common comparator characteristic, where the common comparator output reacts slower as the overdrive decreases.

From an accuracy perspective, the rising and falling thresholds of the FIG. 5 approach can also vary by ±offset, but do not require the large hysteresis which can degrade monitoring accuracy. In this way, several benefits are realized: the hysteresis value remains constant with offset, a small hysteresis value can be specified on a datasheet, and a smaller hysteresis increases monitoring accuracy. Note, however, that the FIG. 5 approach is likely to be somewhat more complex to implement.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A ping pong comparator voltage monitoring circuit, comprising:
   a first comparator having a first input connected to a voltage Vin to be monitored, a second input connected to a first node, and an output which toggles from a first state to a second state when Vin increases above the voltage applied to said first comparator's second input and toggles from said second state to said first state when Vin falls below the voltage applied to said first comparator's second input;
   a second comparator having a first input connected to said voltage Vin, a second input connected to a second node, and an output which toggles from a first state to a second state when Vin increases above the voltage applied to said second comparator's second input and toggles from said second state to said first state when Vin falls below the voltage applied to said second comparator's second input;
   a multiplexer connected to receive the outputs of said first and second comparators at first and second inputs, respectively, and to receive a periodic control signal at a 'select' input, said multiplexer arranged to alternately couple the voltage applied to said first and second inputs to an output in response to said periodic control signal, said multiplexer output being the output of said voltage monitoring circuit;
   a first reference voltage source which produces a voltage $V_{ref1}$ at a third node which is referenced to a circuit common point;
   a second reference voltage source which produces a voltage $V_{ref2}$ at a fourth node which is referenced to said voltage $V_{ref1}$ such that the voltage at said fourth node is given by $V_{ref1}+V_{ref2}$;
   a first hysteresis voltage source which produces a voltage hyst1 and is arranged to be switchably connected between said third node and said first node; and
   a second hysteresis voltage source which produces a voltage hyst2 and is arranged to be switchably connected between said fourth node and said second node;
   said voltage monitoring circuit arranged such that said first and second hysteresis voltage sources are switched in such that the voltage at said first node is $V_{ref1}+$hyst1 and the voltage at said second node is $V_{ref1}+V_{ref2}+$hyst2 when said multiplexer output has toggled from said first state to said second state due to a rising value of Vin, and such that the voltage at said first node is $V_{ref1}$ and the voltage at said second node is $V_{ref1}+V_{ref2}$ when said multiplexer output has toggled from said second state to said first state due to a falling value of Vin.

2. The voltage monitoring circuit of claim 1, arranged such that hyst1>hyst2.

3. The voltage monitoring circuit of claim 1, wherein said second reference voltage source is arranged to output said voltage $V_{ref2}$ with a magnitude such that the average center threshold value for each of said first and second comparators is approximately equal.

4. The voltage monitoring circuit of claim 1, wherein said first and second comparators have associated first and second parasitic offset voltages offset1 and offset2 with the mismatch 'offset' between said offset voltages given by:

offset=|offset1−offset2|, said voltage monitoring circuit arranged such that hyst1≥(hyst2+$V_{ref2}$+offset).

5. The voltage monitoring circuit of claim 1, wherein said first and second comparators have associated first and second parasitic offset voltages offset1 and offset2 with the mismatch 'offset' between said offset voltages given by:

offset=|offset1−offset2|, said circuit arranged such that offset=$V_{ref2}$.

6. The voltage monitoring circuit of claim 1, wherein said first and second comparators have associated first and second parasitic offset voltages offset1 and offset2 with the mismatch 'offset' between said offset voltages given by:

offset=|offset1−offset2|;

said voltage monitoring circuit arranged such that said first comparator has associated trip thresholds Vrise1 and Vfall1 for a rising Vin voltage and a falling Vin voltage, respectively, said trip thresholds Vrise1 and Vrise2 in the case where offset=0 given by:

$V$rise1=$V_{ref1}$+hyst1, and $V$fall1=$V_{ref1}$, with the hysteresis voltage '$V$hyst$_{large}$' for said first comparator given by:

$V$hyst$_{large}$=$V$rise1−$V$fall1=hyst1.

7. The voltage monitoring circuit of claim 1, wherein said first and second comparators have associated first and second parasitic offset voltages offset1 and offset2 with the mismatch 'offset' between said offset voltages given by:

offset=|offset1−offset2|;

said voltage monitoring circuit arranged such that said second comparator has associated trip thresholds Vrise2 and Vfall2 for a rising Vin voltage and a falling Vin voltage, respectively, said trip thresholds Vrise2 and Vfall2 in the case where offset=0 given by:

$$V\text{rise}2 = V_{ref1} + V_{ref2} + \text{hyst}2, \text{ and}$$

$$V\text{fall}2 = V_{ref1} + V_{ref2},$$

with the hysteresis voltage 'Vhyst$_{small}$' for said second comparator given by:

$$V\text{hyst}_{small} = V\text{rise}2 - V\text{fall}2 = \text{hyst}2.$$

8. The voltage monitoring circuit of claim 1, wherein said first and second comparators have associated first and second parasitic offset voltages offset1 and offset2 with the mismatch 'offset' between said offset voltages given by:

$$\text{offset} = |\text{offset}1 - \text{offset}2|;$$

said voltage monitoring circuit arranged such that said second comparator has associated trip thresholds Vrise2 and Vfall2 for a rising Vin voltage and a falling Vin voltage, respectively, said trip thresholds Vrise2 and Vfall2 in the case where offset≠0 given by:

$$V\text{rise}2 = V_{ref1} + V_{ref2} + \text{hyst}2 \pm \text{offset, and}$$

$$V\text{fall}2 = V_{ref1} + V_{ref2} \pm \text{offset},$$

with the hysteresis voltage 'Vhyst$_{small}$' for said second comparator given by:

$$V\text{hyst}_{small} = V\text{rise}2 - V\text{fall}2 = \text{hyst}2.$$

\* \* \* \* \*